US007595968B2

(12) United States Patent
Hung et al.

(10) Patent No.: US 7,595,968 B2
(45) Date of Patent: Sep. 29, 2009

(54) CIRCUIT TO REDUCE INTERNAL ESD STRESS ON DEVICE HAVING MULTIPLE POWER SUPPLY DOMAINS

(75) Inventors: Chih-Ming Hung, McKinney, TX (US); Charvaka Duvvury, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/728,230

(22) Filed: Mar. 23, 2007

(65) Prior Publication Data

US 2007/0223163 A1 Sep. 27, 2007

Related U.S. Application Data

(60) Provisional application No. 60/785,554, filed on Mar. 24, 2006.

(51) Int. Cl.
*H02H 3/22* (2006.01)

(52) U.S. Cl. ........................................ 361/56; 361/111

(58) Field of Classification Search ............. 361/56–58, 361/91.1, 111; 327/427, 434
See application file for complete search history.

(56) References Cited

U.S. PATENT DOCUMENTS 6,437,407 B1 * 8/2002 Ker et al. .................... 257/357
6,803,632 B2 * 10/2004 Kato .......................... 257/357
2006/0114047 A1 * 6/2006 Irino .......................... 327/328

OTHER PUBLICATIONS

Yoon Huh et al., "ESD-induced Internal Core Device Failure: New Failure Modes in System-on-Chip (SOC) Designs," Proc. of the 9th International Database Engineering & Application Symposium (2005.

* cited by examiner

*Primary Examiner*—Danny Nguyen
(74) *Attorney, Agent, or Firm*—Ronald O. Neerings; Wade James Brady, III; Frederick J. Telecky, Jr.

(57) ABSTRACT

An ESD protection circuit is designed on an integrated circuit (100) having a first power supply bus (106) and a second power supply bus (108). The circuit includes a first logic gate (116, 118) having a current path coupled to the first power supply bus. The first logic gate includes an output terminal. A second logic gate (122, 124) has a current path coupled to the second power supply bus. The second logic gate has an input terminal coupled to the output terminal of the first logic gate. A first device (306) is coupled in series with the current path of the second logic gate and is always on during normal circuit operation.

13 Claims, 5 Drawing Sheets

CIRCUIT TO REDUCE INTERNAL ESD STRESS ON DEVICE HAVING MULTIPLE POWER SUPPLY DOMAINS

CROSS-REFERENCES TO RELATED APPLICATIONS

This application claims the benefit, under 35 U.S.C. §119 (e)(1), of U.S. Provisional Application No. 60/785,554, filed Mar. 24, 2006, and incorporated herein by this reference.

FIELD OF THE INVENTION

This invention relates to an integrated circuit protection and more particularly to internal ESD protection an integrated circuit with multiple power supply domains.

BACKGROUND OF THE INVENTION

Present complementary metal oxide semiconductor (CMOS) and bipolar-CMOS (BiCMOS) circuits employ electrostatic discharge protection (ESD) circuits to protect against electrostatic discharge due to ordinary human and machine handling. This electrostatic discharge occurs when the semiconductor circuit contacts an object that is charged to a substantially different electrostatic potential of typically several thousand volts. The contact produces a short-duration, high-current transient in the semiconductor circuit. This high current transient may damage the semiconductor circuit through joule heating. Furthermore, high voltage developed across internal components of the semiconductor circuit may damage MOS transistor gate oxide.

Sensitivity of the semiconductor circuit is determined by various test methods. A human body model test circuit is typically used to determine sensitivity of the semiconductor circuit to human handling. A common human body model test circuit includes a 100 pF capacitor and 1500Ω resistor to emulate a human body resistor-capacitor (RC) time constant of 150 nanoseconds. A stress voltage supply connected in series with a current limiting resistor to charge the 100 pF capacitor to a desired stress voltage. The semiconductor device or device under test (DUT) is connected to the test circuit at a predetermined external terminal for a selected test pin combination. In operation, a switch selects a discharge path through the 1500Ω resistor and the DUT. A post stress current-voltage measurement determines whether the DUT is damaged. Although this test effectively emulates electrostatic discharge from a human body, it fails to comprehend other common forms of electrostatic discharge. Moreover, the relatively high resistance discharge path of the test circuit drops most of the stress voltage during the ESD test, thereby producing a low-voltage test at the DUT.

Another common test circuit of the prior art for tests semiconductor circuits under charged device ESD. This circuit is typically used to determine sensitivity of the semiconductor circuit to ESD under automated manufacturing conditions. The test circuit includes a stress voltage supply connected in series with a current limiting resistor. The DUT forms a capacitor above a ground plane that is typically 1-5 pF. The DUT is precharged to a desired test voltage from the stress voltage supply. A small parasitic resistor and parasitic inductor form a discharge path having an RC time constant typically two orders of magnitude less than the tester of FIG. 5. In operation, a switch connects an external terminal of the DUT to the discharge path through parasitic resistor and parasitic inductor. This connection produces a high-voltage, high-current discharge at the DUT.

All of the foregoing ESD test methods may induce destructive voltage and current levels in internal circuits of a semiconductor. One such internal failure mode was reported by Huh et al., "ESD-induced Internal Core Device Failure: New Failure Modes in System-on-Chip (SOC) Designs," Proceedings of the Fifth Internal Workshop on System-on-Chip for Real-Time Applications, 47-53 (July 2005) and reproduced in Proceedings of the 9th Internal Database Engineering & Application Symposium (IDEAS '05). The reported internal failure occurred at a power domain crossing circuit (PDCC). Multiple power domains are common for complex integrated and may be separately implemented for analog, digital, input/output, or other circuit functions to reduce noise. The power domain crossing circuit includes transmitter and receiver circuits that transfer signals from circuitry in one power domain to circuitry in another power domain.

Referring to FIG. 1A, there is an exemplary power domain crossing circuit of the prior art. A first power domain includes VDD1 bus 102 and VSS1 bus 106. P-channel transistor 116 and N-channel 118 form an inverter connected between VDD1 bus 102 and VSS1 bus 106. The VSS1 bus 106 also includes a metal resistance RM. The first power domain also includes a local power supply protection circuit 110 having an N-channel transistor M1 and a resistor R and capacitor C gate bias circuit. A second power domain includes circuitry powered by VDD2 bus 104 and VSS2 bus 108. P-channel transistor 122 and N-channel 124 form another inverter connected between VDD2 bus 104 and VSS2 bus 108. The second power domain includes a separate local power supply protection circuit 112 having an N-channel transistor M2 and a resistor R and capacitor C gate bias circuit. Bus VSS1 106 is connected to bus VSS2 108 by anti parallel diodes 114 to conduct ESD current during stress testing across the power domains. Alternative power domain designs may omit anti parallel diodes 114 and connect both VSS1 106 and VSS2 108 to a common external terminal or use other isolation means.

In operation, when a sufficient level of positive ESD voltage is applied to VDD1 bus 102 with respect to VSS2 bus 108, the power domain crossing circuit may fail as described with reference to FIG. 1B. Transistor M1 of local power supply protection circuit 110 turns on with the aid of the gate bias circuit to conduct ESD stress current in snapback mode. This typically develops about 7 V across local power supply protection circuit 110 during human body model ESD stress. Here and in the following discussion, voltages are presented by way of explanation of circuit operation and not in a limiting manner. Another 2 V may be developed across metal resistance RM and 1 V across diode 114. A parallel current path between VDD1 bus 102 and VSS2 bus 108 is formed by P-channel transistor 116 and N-channel transistor 124. The gate of P-channel transistor 116 is initially at VSS1 potential during ESD testing. Thus, P-channel transistor 116 is on, and there is approximately 0 V dropped across the source to drain current path. The entire 10 V, therefore, appears across the gate to source terminals of N-channel transistor 124. Gate oxide typically fails at 10 MV/cm. Therefore, failure occurs at the gate to source overlap of N-channel transistor 124 if the gate oxide thickness of less than 10 nm.

Turning now to FIG. 2A, there is another power domain crossing circuit of the prior art as reported by Huh et al. Common reference numerals here and throughout the specification indicate the same circuit elements. Huh et al. improved the previously described power domain crossing circuit by adding N-channel transistor 120 across the gate and source terminals of N-channel transistor 124. Referring to FIG. 2B, this clamp precludes damage voltage levels between the gate and source terminals of N-channel transistor 124 during positive ESD stress of VDD1 bus 102 with respect to VSS2 bus 108. The gate to source voltage N-channel transistor 124 is clamped to approximately 7 V. The remaining 3 V appears across P-channel transistor 116 as a product of channel current and resistance. However, the N-channel transistor clamp 120 increases the load on P-channel transistor 116 and N-channel transistor 118 during normal circuit operation. Additionally, it may degrade ESD performance for positive ESD stress of VSS1 bus 106 with respect to VDD2 bus 104. In view of these limitations, the present inventors have seen a need for further improvement of power domain crossing circuits for both ESD and normal circuit operation.

SUMMARY OF THE INVENTION

These problems are resolved by an ESD protection circuit designed on a single integrated circuit. The integrated circuit has a first and a second power supply bus. The circuit includes a first logic gate having a current path coupled to the first power supply bus. A second logic gate has a current path coupled to the second power supply bus. The second logic gate has an input terminal coupled to an output terminal of the first logic gate. A device is coupled in series with the current path of the second logic gate and is always on during normal circuit operation.

The present invention provides ESD protection to semiconductor circuit elements. During ESD stress, the series device is off and, therefore, reduces voltage developed across the second logic gate.

BRIEF DESCRIPTION OF THE DRAWINGS

A more complete understanding of the invention may be gained by reading the subsequent detailed description with reference to the drawings wherein.

DETAILED DESCRIPTION OF THE PREFERRED EMBODIMENTS

Figure 3A:
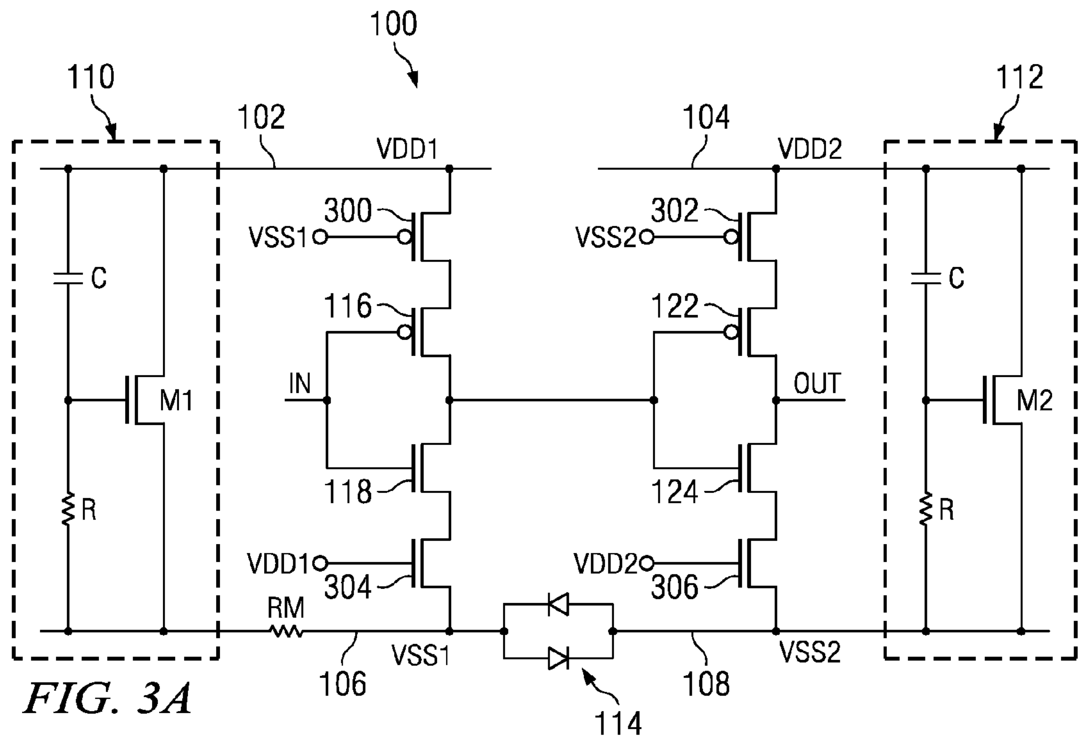
FIG. 3A is a schematic diagram of a first embodiment of the power domain crossing circuit of the present invention.

Referring now to FIG. 3A, there is a schematic diagram of a power domain crossing circuit of the present invention. The circuit employs previously identified circuit elements having the same reference numerals as well as P-channel transistors 300 and 302 and N-channel transistors 304 and 306. The gates of P-channel transistors 300 and 302 are connected to local reference terminals VSS1 106 and VSS2 108, respectively. Likewise, the gates of N-channel transistors 304 and 306 are connected to local positive voltage terminals VDD1 102 and VDD2 104, respectively. In normal circuit operation, therefore, P-channel transistors 300 and 302 and N-channel transistors 304 and 306 are always on. Each of the P-channel and N-channel transistors preferably has the same channel width to twice the channel width of the corresponding series connected logic gate transistor and the same channel length. For example, P-channel transistor 300 has a width from that of P-channel transistor 116 to twice that of P-channel transistor 116. Likewise, N-channel transistor 304 has a width from that of N-channel transistor 118 to twice that of N-channel transistor 118. Alternative embodiments of the present invention may employ various combinations and sizes of these transistors 300-306 as will become apparent in the following discussion.

Figure 1A:
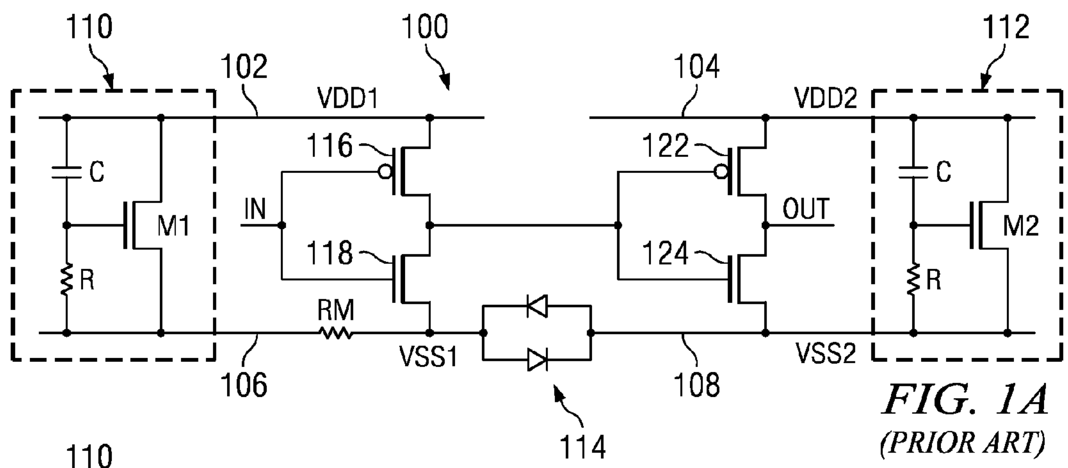
FIG. 1A is a schematic diagram of power domain crossing circuit of the prior art.
Figure 1B:
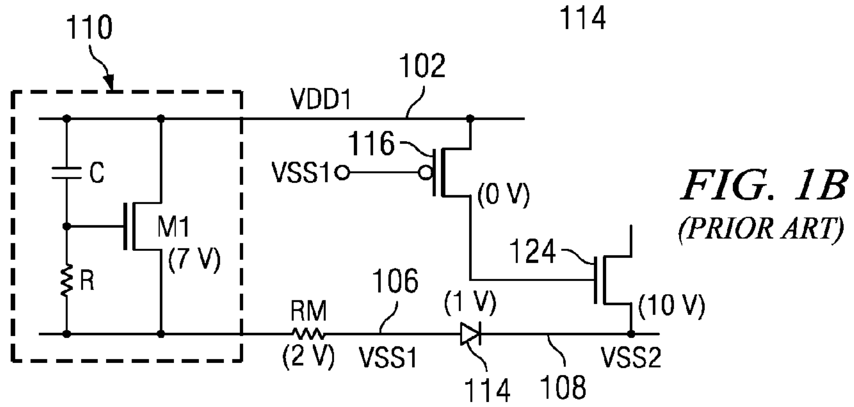
FIG. 1B is a simplified schematic diagram of the power domain crossing circuit of FIG. 1A showing the related components for one polarity of ESD stress.
Figure 2A:
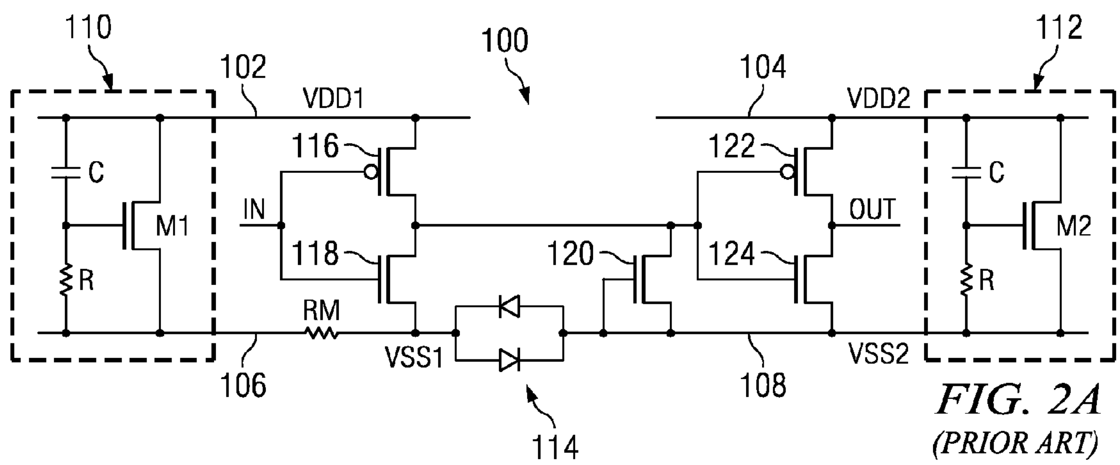
FIG. 2A is a schematic diagram of a modified power domain crossing circuit of the prior art.
Figure 2B:
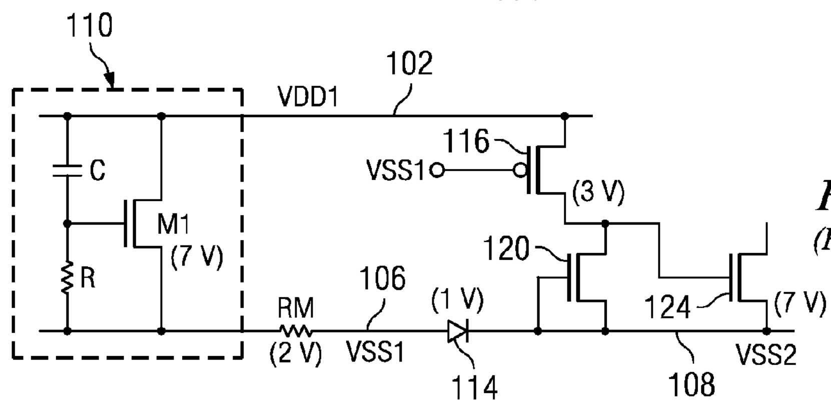
FIG. 2B is a simplified schematic diagram of the power domain crossing circuit of FIG. 2A showing the related components for one polarity of ESD stress.
Figure 3B:
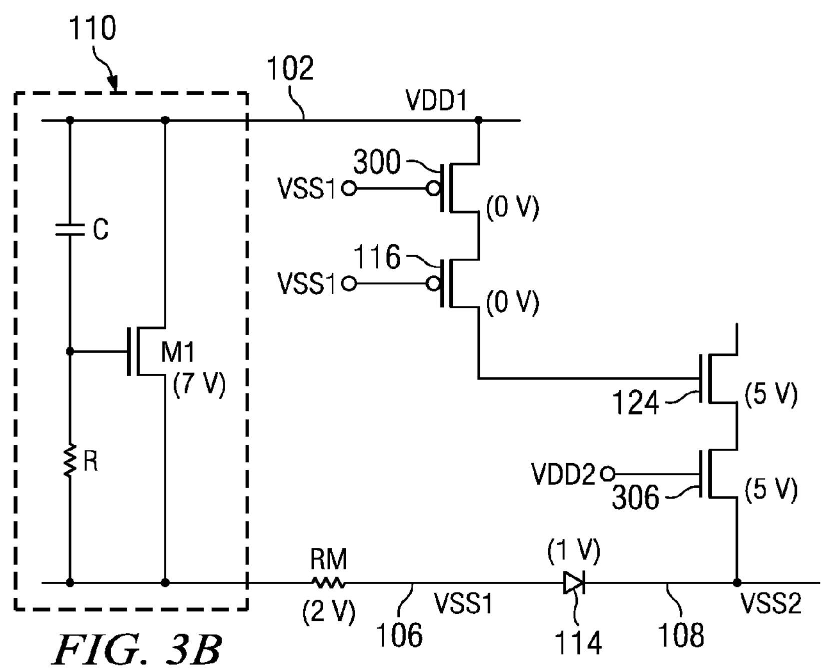
FIG. 3B is a simplified schematic diagram of the power domain crossing circuit of FIG. 3A showing the related components for one polarity of ESD stress.

Referring now to FIG. 3B, operation of the circuit of FIG. 3A will be described in detail for positive ESD stress at VDD1 102 with respect to VSS2 108. The positive ESD stress is applied before the semiconductor integrated circuit 100 is installed in a system. All terminals, therefore, are initially at ground or reference potential as determined by the ESD test apparatus. The exemplary ESD stress pulse produces 7 V across local power supply protection circuit 110, 2 V across metal resistance RM, and 1 V across diode 114 as previously described. A parallel current path between VDD1 102 and VSS2 108 includes P-channel transistors 300 and 116 and N-channel transistors 124 and 306. Control gates of P-channel transistors 300 and 116 are both at VSS1 potential or about 1 V. Thus, the voltage drop across each of P-channel transistors 300 and 116 is approximately 0 V. The control gate of N-channel transistor 306 is at VDD2 potential of approximately 0 V. Thus N-channel transistor 306 is off. In this state, N-channel transistor 306 and N-channel transistor 124 act as two series connected capacitors. When N-channel transistor 306 has a channel width approximately equal to the channel width of N-channel transistor 124, the 10 V between VDD1 102 and VSS2 108 is equally divided between them. There is approximately 5 V across the gate to source capacitance of N-channel transistor 124 and 5 V across the drain to gate capacitance of N-channel transistor 306. This is about 50% of the voltage that would appear across N-channel transistor 124 in the circuit of FIG. 1B and about 70% of the voltage that would appear across N-channel transistor 124 in the circuit of FIG. 2B. This reduction of peak voltage during ESD stress advantageously improves the failure threshold of the semiconductor integrated circuit 100 without significant degradation of normal circuit operation.

Figure 3C:
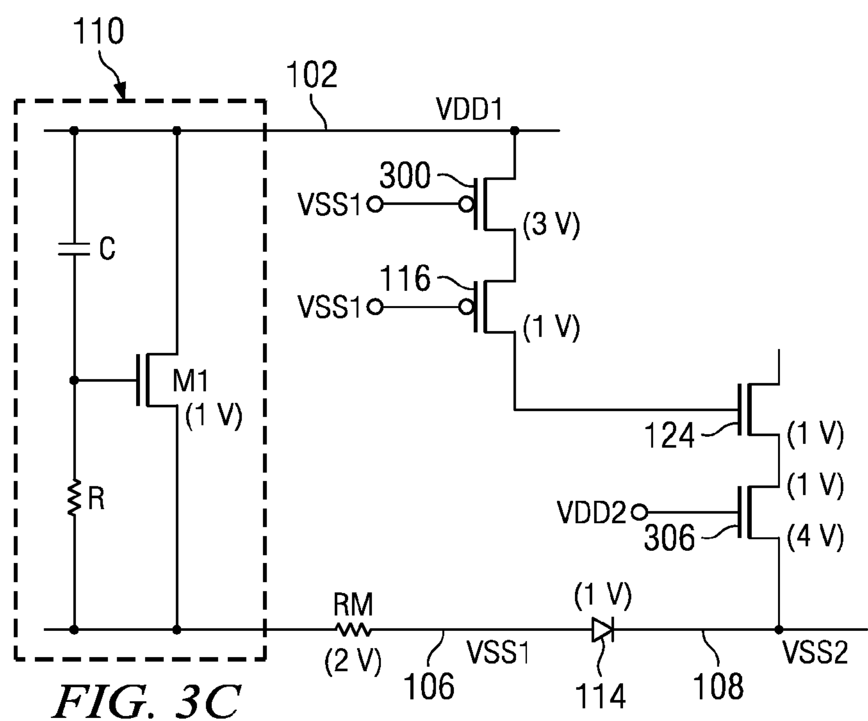
FIG. 3C is a simplified schematic diagram of the power domain crossing circuit of FIG. 3A showing the related components for another polarity of ESD stress.

Turning now to FIG. 3C, operation of the circuit of FIG. 3A will be described in detail for positive ESD stress at VSS2 108 with respect to VDD1 102. This is similar to the previously discussed ESD stress of FIG. 3B but with opposite polarity. All terminals are initially at ground or reference potential of VDD1 102 for this polarity. The exemplary ESD stress pulse produces 1 V across diode 114, 2 V across metal resistance, and 1 V across local power supply protection circuit 110. The reduced voltage (1 V) across local power supply protection circuit 110 is due to forward bias conduction of the parasitic lateral NPN transistor associated with transistor M1 rather than snapback operation as discussed for the polarity of FIG. 3B. A parallel current path between VSS2 108 and VDD1 102 includes P-channel transistors 300 and 116 and N-channel transistors 124 and 306. Here, however, control gates of P-channel transistors 300 and 116 are both at VSS1 potential or about 3 V with respect to VDD1 102. Thus, the gate to drain voltage drop (VSS1-VDD1) across P-channel transistor 300 is 3 V. The control gate of N-channel transistor 306 is at VDD2 potential of approximately 0 V. Thus N-channel transistor 306 is off, and the drain to gate voltage drop (VSS2-VDD2) for N-channel transistor 306 is 4 V. Finally, when P-channel transistor 116 has a channel width approximately equal to the channel width of N-channel transistors 124 and 306, the 3 V between VSS1 106 and VDD2 104 is equally divided between them by charge sharing.

Figure 4A:
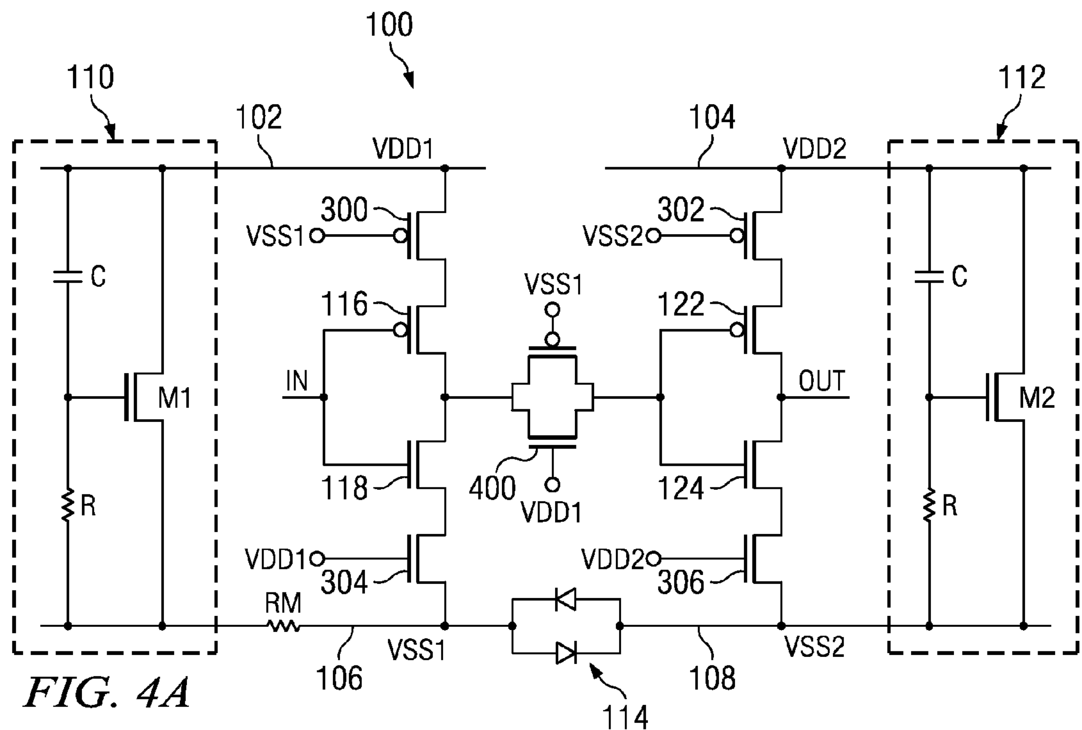
FIG. 4A is a schematic diagram of a second embodiment of the power domain crossing circuit of the present invention.

Referring now to FIG. 4A, there is a schematic diagram of a second embodiment of the power domain crossing circuit of the present invention. The circuit is the same as previously described with respect to FIG. 3A with the addition of CMOS pass gate 400. The CMOS pass gate includes a P-channel transistor having a control gate connected to VSS1 106 and an N-channel transistor having a control gate connected to VDD 1102. The CMOS pass gate, therefore, is always on during normal circuit operation. During positive ESD stress of VDD2 104 with respect to VSS1 106, the N-channel transistor of the CMOS pass gate 400 is off. The P-channel transistor of the CMOS pass gate 400 is on. This condition facilitates charge sharing between P-channel transistors 302 and 122, N-channel transistor 118, and both transistors of the CMOS pass gate 400. During positive ESD stress of VSS1 106 with respect to VDD2 104, both the N-channel transistor and the P-channel transistor of the CMOS pass gate 400 are off. Peak voltage for this polarity is distributed between P-channel transistors 302 and 122 and the CMOS pass gate 400. As previously described, this charge sharing process advantageously reduces peak voltage across gate oxide of power domain crossing circuits, thereby increasing the failure threshold of the semiconductor integrated circuit.

Figure 4B:
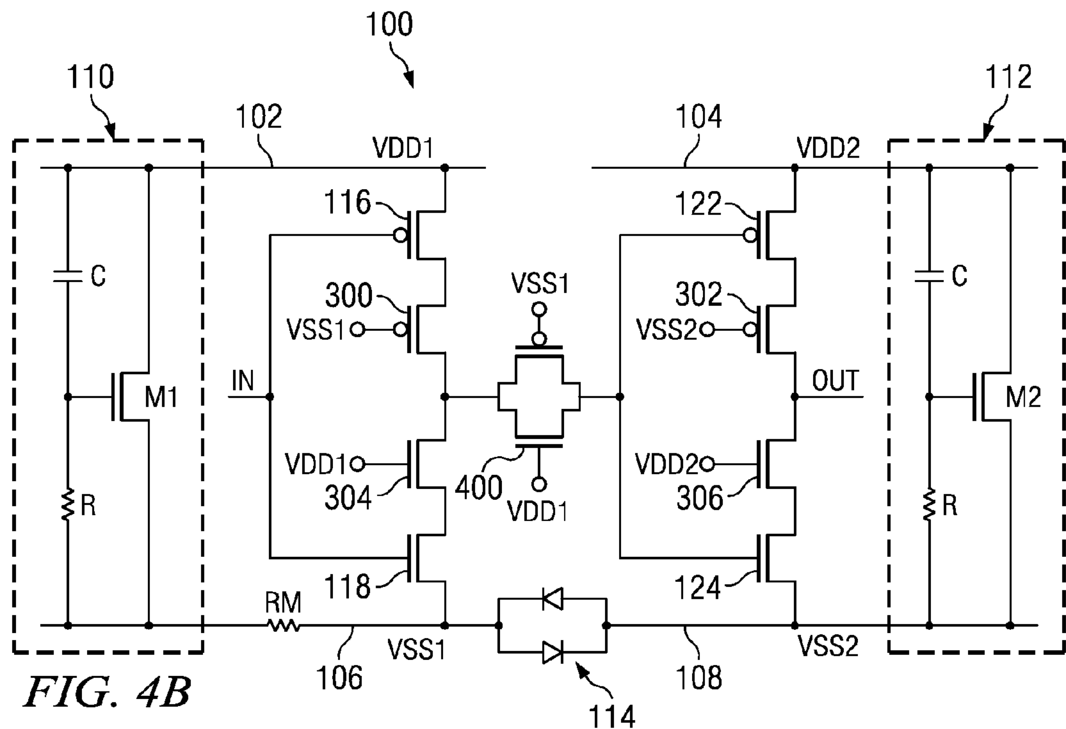
FIG. 4B is a schematic diagram of a third embodiment of the power domain crossing circuit of the present invention.

Turning now to FIG. 4B, there is a schematic diagram of a third embodiment of the power domain crossing circuit of the present invention. This embodiment is similar to the embodiment of FIG. 4A except that the positions of the logic gate transistors and their corresponding series connected transistors are reversed with respect to the previous embodiment. For example, P-channel transistors 116 and 300 are reversed as well as N-channel transistors 118 and 304. The power domain circuit operates substantially in the same manner as previously described, except the body effect for each of the logic gate transistors 116, 118, 122 and 124 is reduced by moving the series connected transistors from the source side to the drain side. This advantageously improves normal circuit operation without compromising ESD performance.

Figure 5:
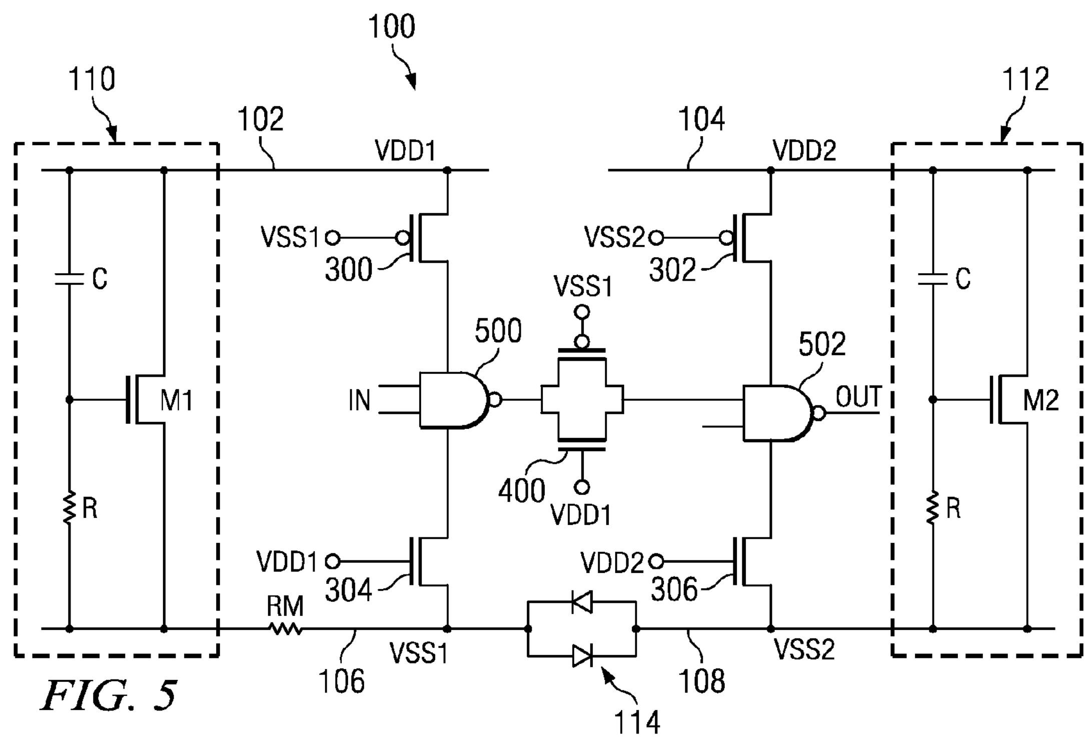
FIG. 5 is a schematic diagram of a fourth embodiment of the power domain crossing circuit of the present invention.
Figure 6:
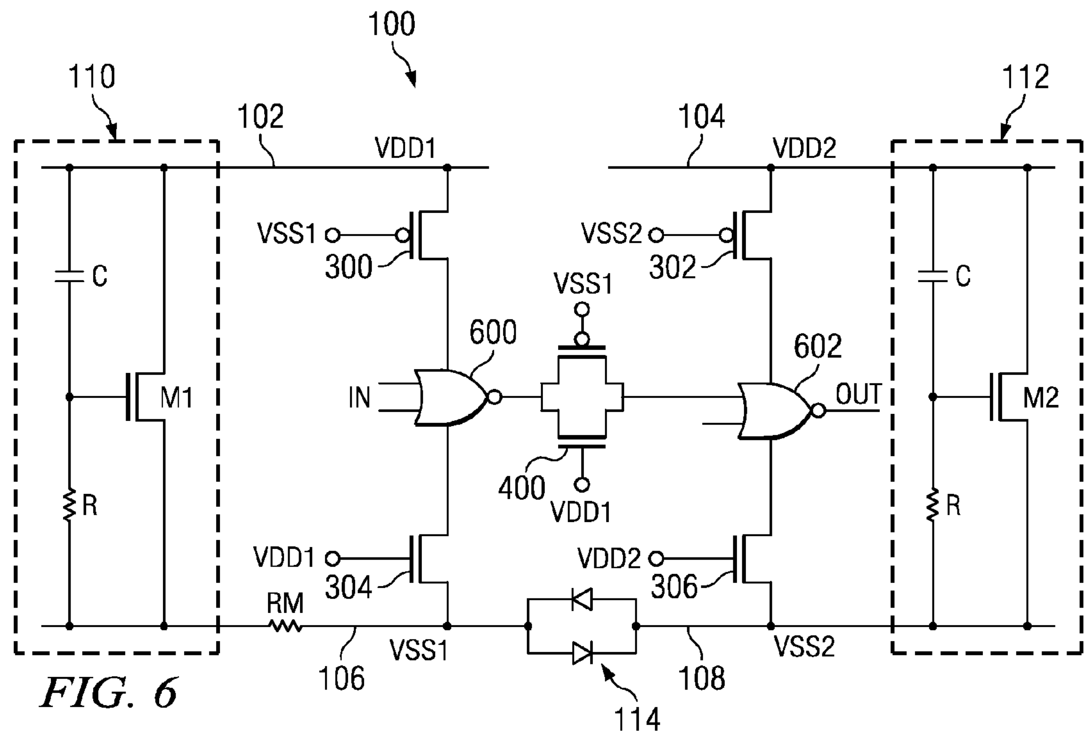
FIG. 6 is a schematic diagram of a fifth embodiment of the power domain crossing circuit of the present invention.

The power domain crossing circuit of FIG. 5 is similar to the previously discussed embodiment of FIG. 4A. Logic gate transistors 116, 118, 122 and 124, however, are replaced with NAND gates 500 and 502, respectively. The embodiment of FIG. 6 is also similar to FIG. 4A, but the logic gate transistors 116, 118, 122 and 124 are replaced with NOR gates 600 and 602, respectively. In each embodiment, ESD performance is substantially improved through charge sharing of the logic gate transistors with their corresponding series connected transistors. Moreover, the present invention may be readily adapted to any complex logic gates where analog or digital signals must cross power domains.

It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A circuit, comprising:

a first power supply bus;

a first reference bus;

a second power supply bus;

a second reference bus;

a first logic gate having a current path coupled between the first power supply bus and the first reference bus, the first logic gate having a first terminal;

a second logic gate having a current path coupled between the second power supply bus and the second reference bus, the second logic gate having a second terminal;

a first transistor of a first conductivity type having a current path coupled between the first and second terminals and having a gate coupled to the first power supply bus;

a second transistor of a second conductivity type having a current path coupled between the first and second terminals and having a gate coupled to the first reference bus; and a first device coupled in series with the current path of the second logic gate, the first device being always on during normal circuit operation.

2. A circuit as in claim 1, comprising a second device coupled in series with the current path of the first logic gate, the second device being always on during normal circuit operation.

3. A circuit as in claim 1, comprising a second device coupled in series with the current path of the second logic gate, the second device being always on during normal circuit operation.

4. A circuit as in claim 3, wherein the second logic gate is a CMOS logic gate having a P-channel transistor and an N-channel transistor connected in series, and wherein the first device is connected to a source of the N-channel transistor and the second device is connected to a source of the P-channel transistor.

5. A circuit as in claim 3, wherein the second logic gate is a CMOS logic gate having a P-channel transistor and an N-channel transistor connected in series, and wherein the first device is connected to a drain of the N-channel transistor and the second device is connected to a drain of the P-channel transistor.

6. A circuit as in claim 1, wherein the first reference bus is coupled to the second reference bus by anti parallel diodes.

7. A circuit as in claim 1, wherein the first reference bus is coupled to the second reference bus by external power supply terminals.

8. A circuit, comprising:

a first power supply bus;

a first reference bus;

a second power supply bus;

a second reference bus;

a first logic gate having a current path coupled between the first power supply bus and the first reference bus, the first logic gate having an output terminal;

a second logic gate having a current path coupled between the second power supply bus and the second reference bus, the second logic gate having an input terminal;

a first transistor of a first conductivity type having a current path coupled between the output and input terminals and having a gate coupled to the first power supply bus;

a second transistor of a second conductivity type having a current path coupled between the output and input terminals and having a gate coupled to the first reference bus; and a first device coupled in series with the current path of the first logic gate, the first device being always on during normal circuit operation.

9. A circuit as in claim 8, comprising a second device coupled in series with the current path of the first logic gate, the second device being always on during normal circuit operation.

10. A circuit as in claim 9, wherein the first logic gate is a CMOS logic gate having a P-channel transistor and an N-channel transistor connected in series, and wherein the first device is connected to a source of the N-channel transistor and the second device is connected to a source of the P-channel transistor.

11. A circuit as in claim 9, wherein the second logic gate is a CMOS logic gate having a P-channel transistor and an N-channel transistor connected in series, and wherein the first device is connected to a drain of the N-channel transistor and the second device is connected to a drain of the P-channel transistor.

12. A circuit as in claim 8, wherein the first power supply bus is coupled to the second power supply bus by anti parallel diodes.

13. A circuit as in claim 8, wherein the first power supply bus is coupled to the second power supply bus by external power supply terminals.

* * * * *